United States Patent
Fan

(10) Patent No.: US 7,847,603 B2
(45) Date of Patent: Dec. 7, 2010

(54) DRIVING CIRCUITS IN ELECTRONIC DEVICE

(75) Inventor: Wen-Teng Fan, Tainan County (TW)

(73) Assignee: Himax Technologies Limited, Tainan County (TW)

( * ) Notice: Subject to any disclaimer, the term of this patent is extended or adjusted under 35 U.S.C. 154(b) by 0 days.

(21) Appl. No.: 12/030,513

(22) Filed: Feb. 13, 2008

(65) Prior Publication Data

US 2009/0201054 A1    Aug. 13, 2009

(51) Int. Cl.
*H03B 1/00* (2006.01)
(52) U.S. Cl. .................... 327/108; 327/112; 327/427
(58) Field of Classification Search ......... 327/108–112, 327/170, 389, 391, 427; 326/26, 27, 82, 326/83
See application file for complete search history.

(56) References Cited

U.S. PATENT DOCUMENTS

| 4,837,462 A * | 6/1989 | Watanabe et al. ........... 326/108 |
| 6,603,334 B1 * | 8/2003 | Takahashi ................... 327/108 |
| 7,652,506 B2 * | 1/2010 | Aoki .......................... 326/83 |

FOREIGN PATENT DOCUMENTS

CN    101507106    8/2009

* cited by examiner

*Primary Examiner*—Long Nguyen
(74) *Attorney, Agent, or Firm*—J.C. Patents

(57) ABSTRACT

In driving circuits, signal enhancing circuits are used to enhance driving ability of driving signals. Further, source follower transistors may further enhance driving ability of the driving circuits by conducting more current to loading, so that output signals of the driving circuits may transit more rapidly. In other words, the pull high ability of the driving circuits is enhanced.

9 Claims, 9 Drawing Sheets

DRIVING CIRCUITS IN ELECTRONIC DEVICE

BACKGROUND OF THE INVENTION

1. Field of Invention

The present invention relates to a source driving circuit in an electronic device with enhanced driving capability.

2. Description of Related Art

In a liquid crystal display, a source driver applies analog voltages to the display panel. The source driver should have high-speed operation, accuracy and less power consumption.

The source driver receives video data from a timing controller, converts the video data into a high-voltage analog signal suitable for the panel, and outputs the high voltage analog signal to the panel on a horizontal line basis.

For displaying a high-quality image, the color depth and resolution of the panel increases, which in turn imposes a rigorous timing to process more bits of data during a given cycle.

FIG. 1a is a block diagram of a display device including a source driver and a display panel 19. The source driver includes a plurality of channels 10-1, 10-2 ... 10-i. Each of the channels 10-1, 10-2 ... 10-i includes a latch 12, a digital-to-analog converter (DAC) 14, and a buffer 16.

FIG. 1b is a timing diagram illustrating an operation of the source driving circuit illustrated in FIG. 1a. Referring to FIG. 1b, in response to a horizontal synchronization signal Hsync that is an input signal of the timing controller, RGB video data (..., N−1, N, N+1, N+2, N+3, ...) are sequentially input into the channels 10-1, 10-2, ..., 10-i. The input data (..., N−1, N, N+1, N+2, N+3, ...) are sequentially or simultaneously converted into analog signals at the channels 10-1, 10-2, ..., 10-i, and the analog signals are simultaneously output to the display panel 20 through the output switches SW of the channels 10-1, 10-2, ..., 10-i.

In an example, data N−1 corresponding to a first horizontal line are sequentially input into the channels 10-1, 10-2, ..., 10-i during a period I. The input data N−1 are converted into analog signals by the channels 10-1, 10-2, ..., 10-i. The analog signals are simultaneously output to the display panel 19 through the output switches of the channels 10-1, 10-2, ..., 10-i during a second period II.

Similarly, the data N corresponding to a second horizontal line are sequentially input into the channels 10-1, 10-2, ..., 10-i during the period II. The input data N are converted into analog signals by the channels 10-1, 10-2, ..., 10-i, and the analog signals are simultaneously output to the display panel 19 through the output switches of the channels 10-1, 10-2, ..., 10-i during a third period III.

There are plural logic gates in the circuits of the channels 10-1, 10-2, ..., 10-i, such as CMOS inverters. The rise time and fall time of logic gates should be designed as short as possible. The rise time and fall time of inverters, for example, are related to power supply, W/L ratio of transistors, and output loading. In one example, the output driving ability of inverters degrades rapidly when the power supply voltage is lower than a normal voltage. This is because the turn-on current of PMOS transistors is proportional to square of ($V_{SG}$-Vth), $V_{SG}$ refers to source-gate voltage of PMOS transistors and Vth refers to threshold voltage of PMOS transistor. Thus, the driving ability of PMOS transistors and CMOS inverters degrade due to the lower turn-on current.

Typically, design of power supply is related to CMOS process. For example, power supply of 3.3V is used in 0.35 µm process devices; power supply of 5V is used in 0.5 µm process devices. However, in some cases, the requirement is to implement power supply of 1.8V in 0.5 µm process devices or power supply of 1.3V in 0.35 µm process devices. The issue of degradation of driving ability due to low power supply voltage gets more and more serious. Further, when driving a heavy loading, the rise time and fall time also degrade.

Therefore, there is a need to design a circuit with enhanced driving capability, even in case of low power supply voltage and low end process.

SUMMARY OF THE INVENTION

The invention is directed to provide an enhanced driving circuit, which is capable of enhancing driving ability of the input signal by a signal enhancement circuit.

The invention is directed to provide an enhanced driving circuit, which is capable of enhancing driving ability by a source follower transistor.

One example of the invention provides a driving circuit, comprising: a signal enhancing circuit, for generating a second input signal in response to a first input signal, wherein the second input signal has a higher driving ability than the first input signal; a first transistor, coupled to the signal enhancing circuit and supplied by a first power supply, the first transistor being driven by the second input signal; and a second transistor, coupled to the signal enhancing circuit, the second transistor being driven by the second input signal.

Another example of the invention provides a driving circuit, comprising: a signal enhancing circuit, for generating a second input signal in response to a first input signal and an inverted signal of the first input signal, wherein the second input signal has a higher driving ability than both the first input signal and the inverted signal of the first input signal; a source follower transistor, coupled to the signal enhancing circuit and supplied by a first power supply, the source follower transistor being driven by the second input signal; a first transistor, coupled to the source follower transistor and supplied by the first power supply, the first transistor being driven by the first input signal; and a second transistor, coupled to the source follower transistor, the second transistor being driven by the first input signal; wherein the source follower transistor conducting more current than the first transistor.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 1b is a timing diagram illustrating an operation of the source driving circuit illustrated in FIG. 1a.

DESCRIPTION OF THE EMBODIMENTS

Figure 1A:
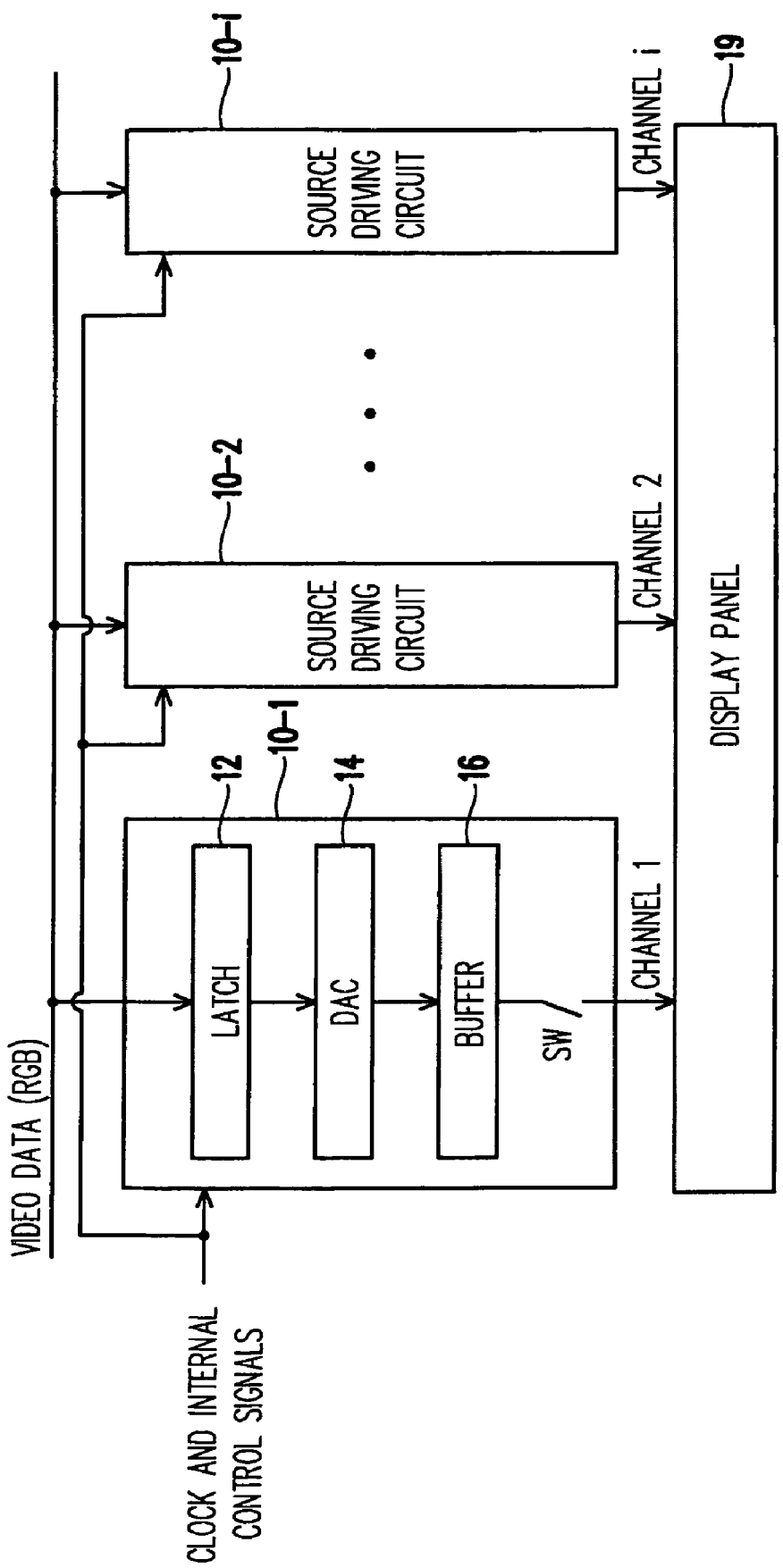
FIG. 1a is a block diagram of a display device including a conventional source driving circuit.
Figure 1B:
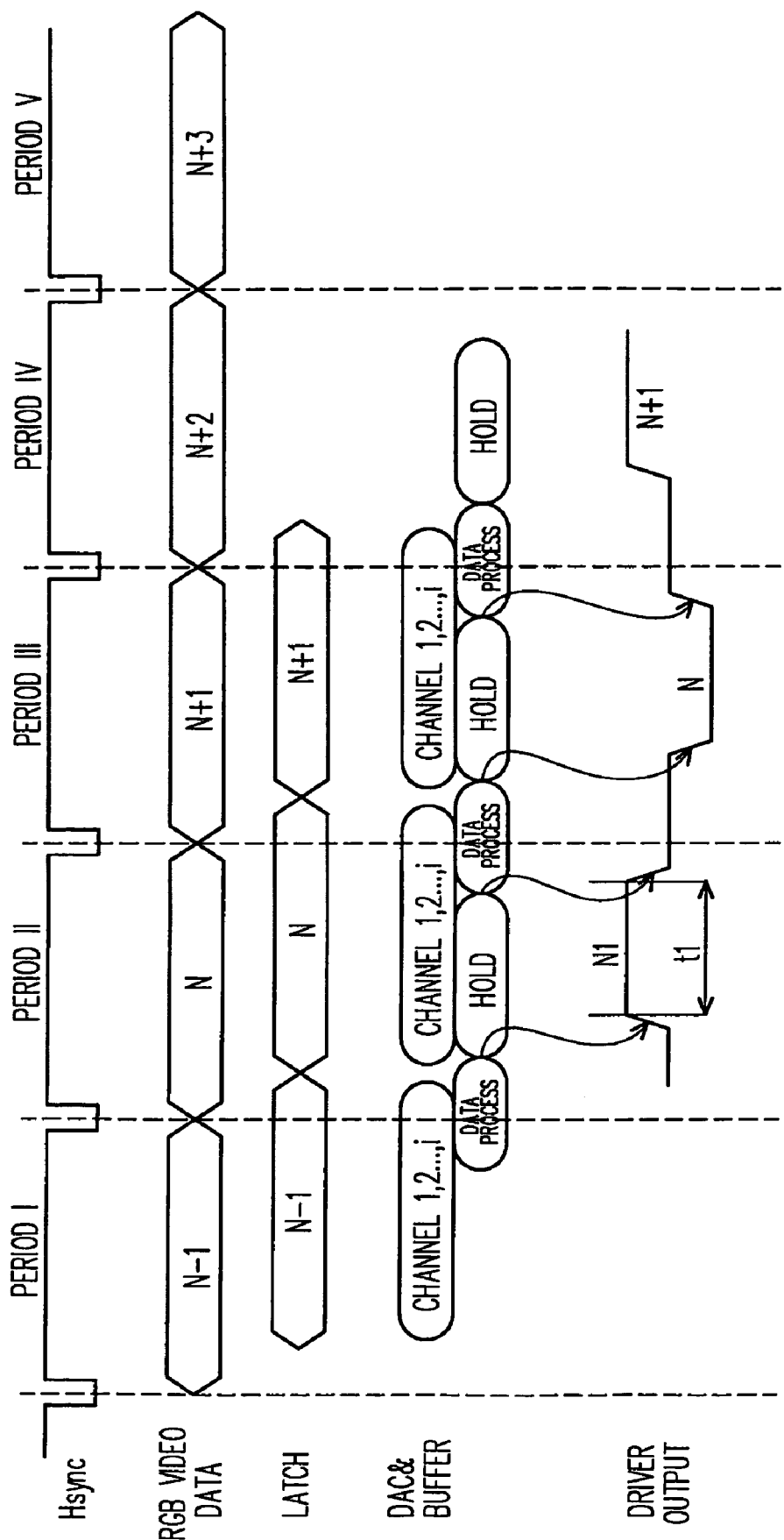

Reference will now be made in detail to the present embodiments of the invention, examples of which are illustrated in the accompanying drawings. Wherever possible, the same reference numbers are used in the drawings and the description to refer to the same or like parts.

First Embodiment

Figure 2:
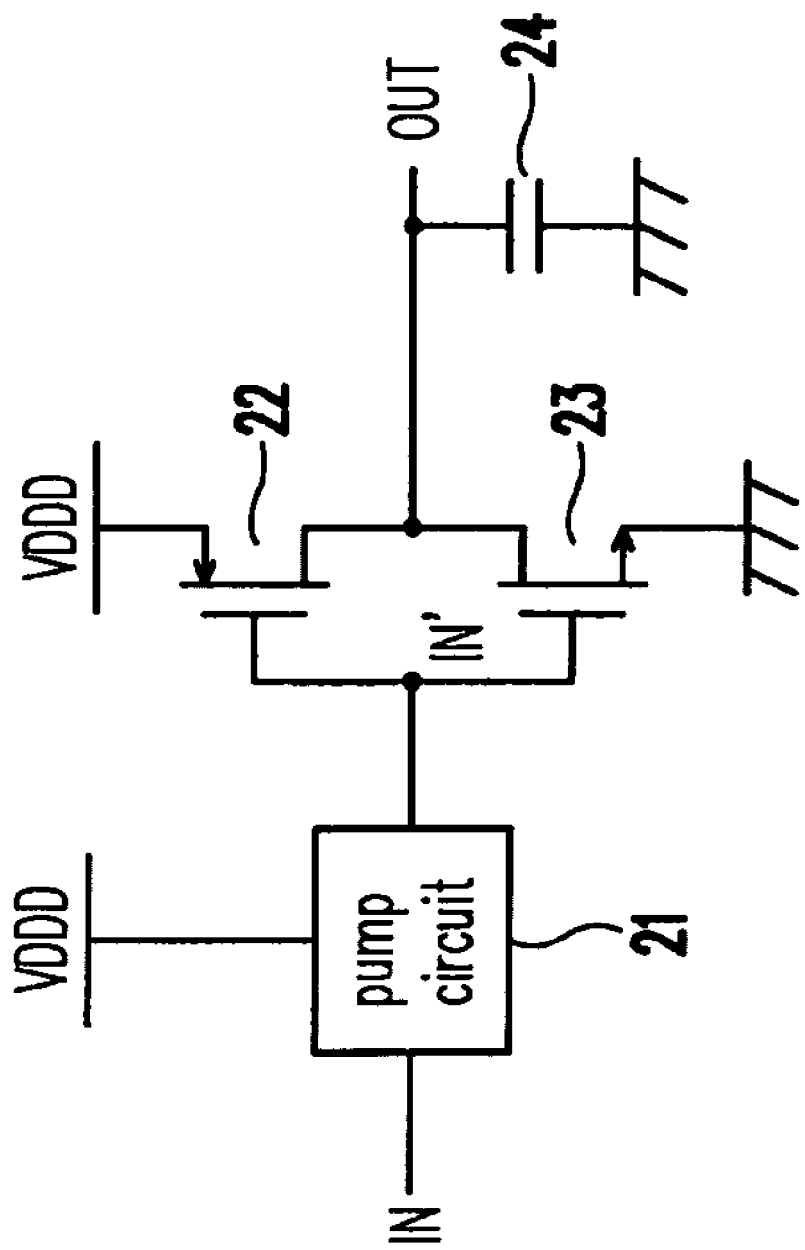
FIG. 2 shows a circuit diagram of a driving circuit according to a first embodiment of the invention.

FIG. 2 shows a circuit diagram of a logic gate according to a first embodiment of the invention. As shown in FIG. 2, the logic gate is used as a driving circuit and includes a pump circuit 21, a PMOS transistor 22 and a NMOS transistor 23. The power supply VDDD is for example but not limited to 3.5 v, 2.5 v or 1.8V. "OUT" refers to an output signal. The load element 24 is represented by, for example, a load capacitor. In the first embodiment, the pump circuit is used to improve the driving ability.

The pump circuit 21 is used for generating a driving signal IN' in response to a driving signal IN, wherein the driving signal IN' has higher driving ability than the driving signal IN. In other words, the pump circuit 21 is used for increasing driving ability of signals.

The PMOS transistor 22 is coupled to the pump circuit 21, the NMOS transistor 23 and the load element 24. The PMOS transistor 22 is supplied by the low power supply VDDD. The PMOS transistor 22 is driven by the driving signal IN'.

The PMOS transistor 22 includes a source terminal coupled to the power supply VDDD, a gate terminal coupled to the driving signal IN' and a drain terminal coupled to the load element 24. The load element 24 is charged by the PMOS transistor 22.

The NMOS transistor 23 is coupled to the pump circuit 21, the PMOS transistor 22 and the load element 24. The NMOS transistor 23 is also driven by the driving signal IN'.

The NMOS transistor 23 includes a source terminal coupled to GND, a gate terminal coupled to the driving signal IN' and a drain terminal coupled to the load element 24. The load element 24 is discharged by the NMOS transistor 23.

Figure 3A:
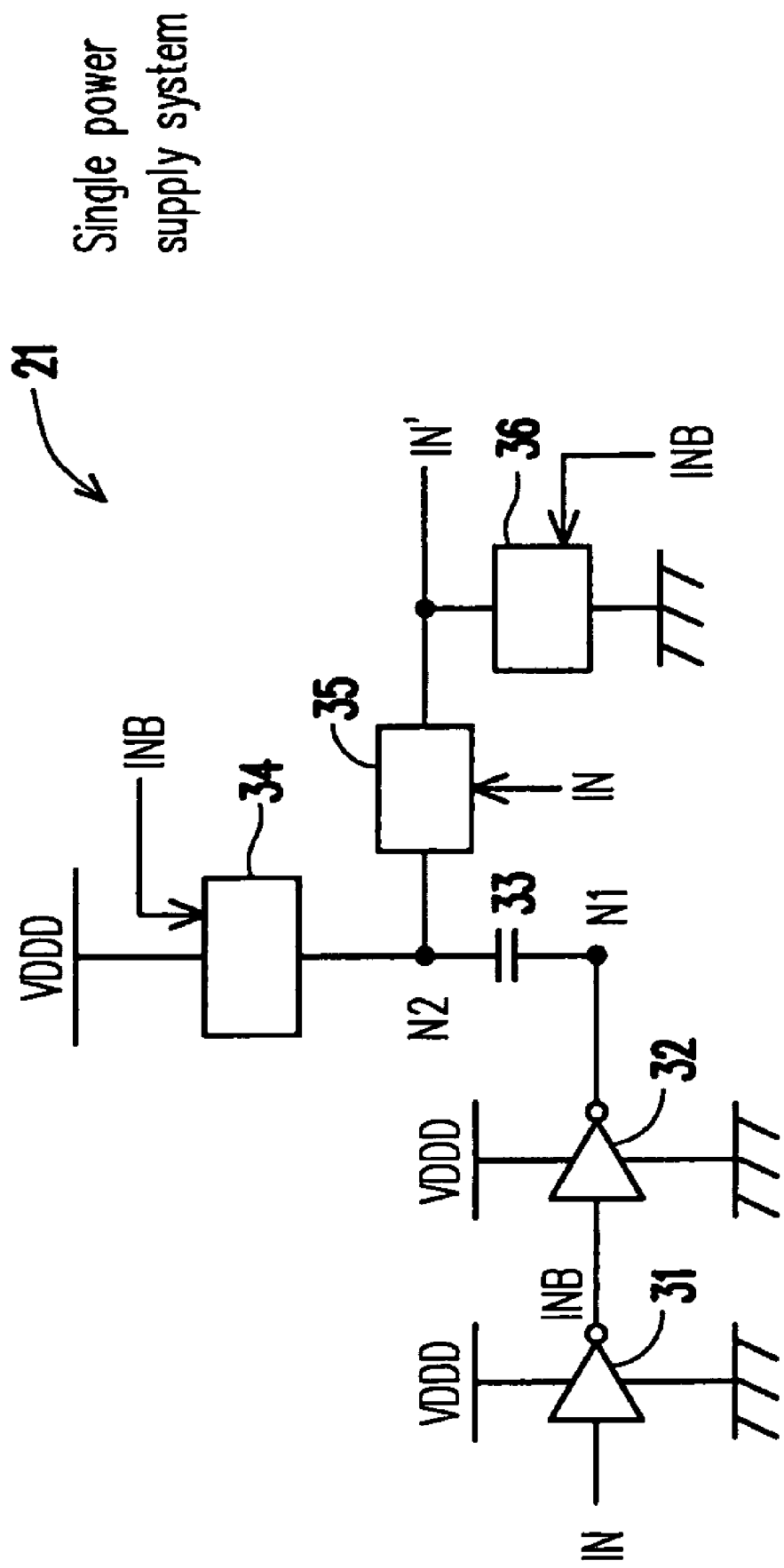
FIG. 3a shows a circuit diagram of the pump circuit applicable in the first embodiment of the invention.

Now, please refer FIG. 3a which shows a circuit diagram of the pump circuit 21. As shown in FIG. 3a, the pump circuit 21 includes inverters 31 and 32, a capacitor 33, and switches 34~36.

The inverter 31 is powered by the power supply VDDD. The inverter 31 has an input terminal for receiving the driving signal IN and an output terminal for providing an inverted signal INB of the driving signal IN.

The inverter 32 is powered by the power supply VDDD. The inverter 32 has an input terminal for receiving the inverted signal INB of the driving signal IN and an output terminal for being coupled to a first node N1. In other words, the first node N1 is in phase with the driving signal IN.

The capacitor 33 is coupled between the first node N1 and a second node N2.

The switch 34 selectively connects the power supply VDDD to the second node N2 in response to the driving signal IN. Specifically, the switch 34 is controlled by the inverted signal INB of the driving signal IN. For example, when IN=logic H (INB=logic L), the switch 34 is turned off. When IN=logic L (INB=logic H), the switch 34 is turned on.

The switch 35 selectively connects the second node N2 to the driving signal IN' in response to the driving signal IN. Specifically, the switch 35 is controlled by the driving signal IN. For example, when IN=logic H (INB=logic L), the switch 35 is turned on. When IN=logic L (INB=logic H), the switch 35 is turned off.

The switch 36 is selectively conductive between the pump node N3 and GND in response to the driving signal IN. Specifically, the switch 36 is controlled by the inverted signal INB of the driving signal IN. For example, when IN=logic H (INB=logic L), the switch 36 is turned off. When IN=logic L (INB=logic H), the switch 36 is turned on.

Figure 3B:
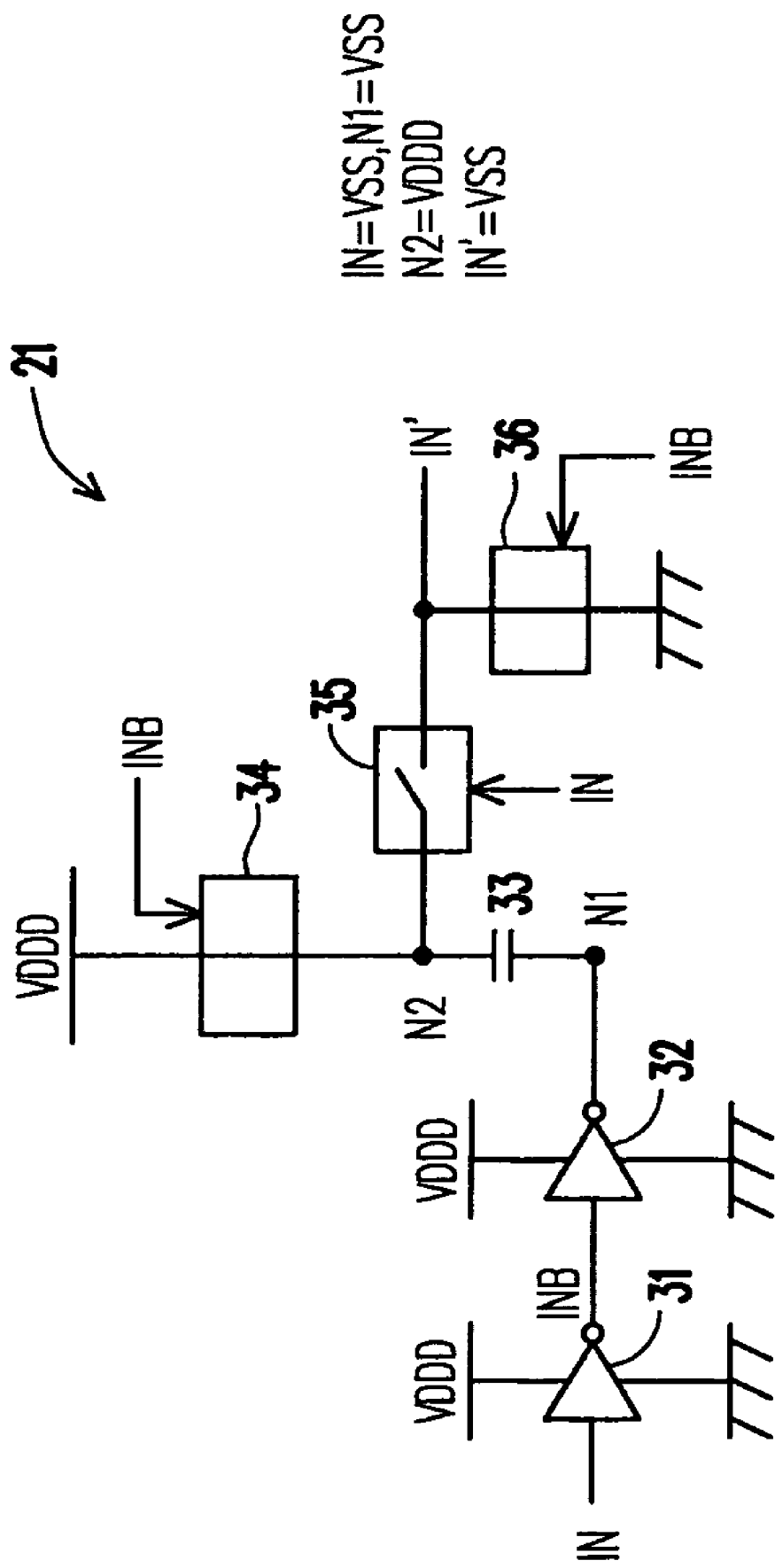
FIG. 3b shows operation of the pump circuit 21 applicable in the first embodiment of the invention, under IN=VSS (logic L).
Figure 3C:
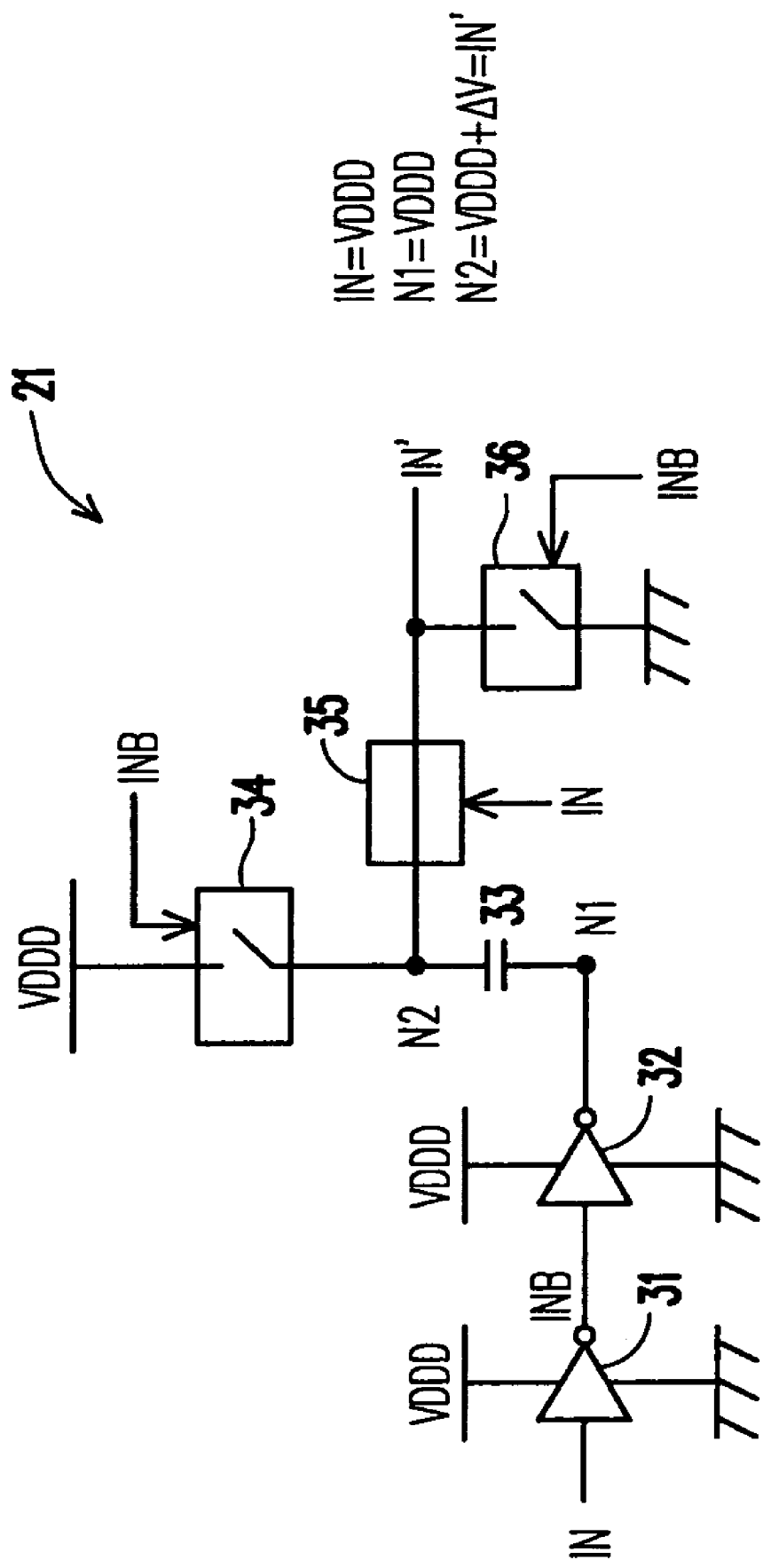
FIG. 3c shows operation of the pump circuit 21 applicable in the first embodiment of the invention, under IN=VDDD (logic H).

FIG. 3b and FIG. 3c respectively show operation of the pump circuit 21 under IN=VSS (logic L) and IN=VDDD (logic H). As shown in FIG. 3b, when IN=VSS (logic L), the node N1 is also at VSS (logic L). Because the switch 34 is turned on, the node N2 is at VDDD. The node N2 disconnected the node N2 from the pump node N3 because the switch 35 is turned off. The driving signal IN' is at VSS (logic L) because the switch 36 is turned on. In other words, the driving signal IN' is at VSS (logic L) when the driving signal IN is at VSS (logic L).

As shown in FIG. 3c, when IN changes from VSS to VDDD (logic H), the switch 34 is turned off and the voltage at the node N2 is pumped from VDDD to VDDD+ΔV, which is output to the pump node N3 as the driving signal IN' via the switch 35. The driving signal IN' is disconnected from GND because the switch 36 is turned off. The driving signal IN' is at VDDD+ΔV when the driving signal IN is at VDDD. In other words, the driving signal IN' has higher driving ability when the driving signal IN is changes from logic L to logic H.

Further, in this embodiment, if the transistors 22 and 23 are made by low end process, i.e. they have thick gate oxide, the transistors 22 and 23 can stand high gate voltage.

Second Embodiment

Figure 4:
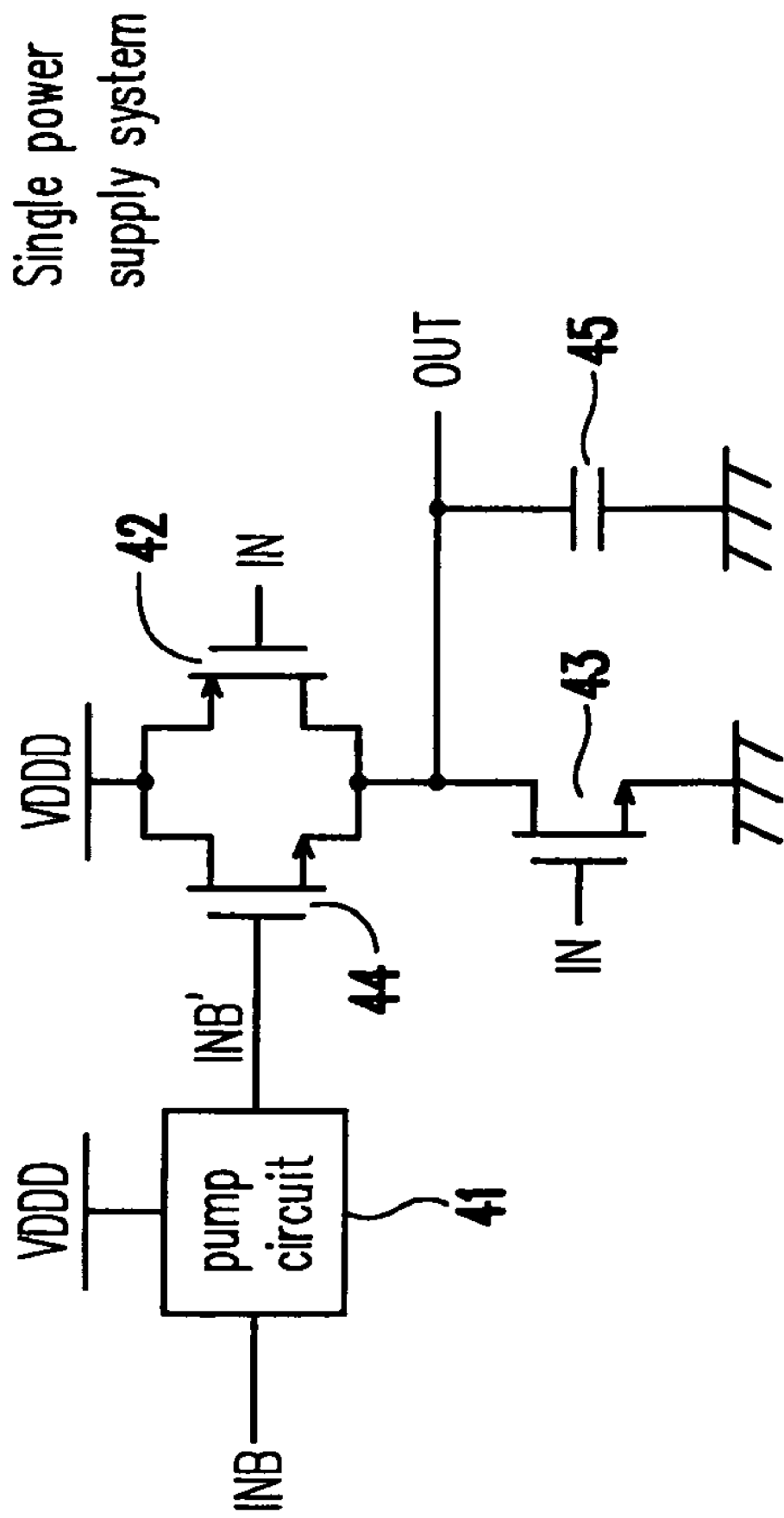
FIG. 4 shows a circuit diagram of a driving circuit according to a second embodiment of the invention.

FIG. 4 shows a circuit diagram of a logic gate as a driving circuit according to a second embodiment of the invention. As shown in FIG. 4, the driving circuit according to the second embodiment of the invention includes a pump circuit 41, a PMOS transistor 42, a NMOS transistor 43 and a source follower transistor 44. The load element 45 is represented by, for example, a load capacitor. The pump circuit 41 is used to improve the driving ability. The pump circuit 41 may have similar or the same function and structure with the pump circuit 21. Therefore, for simplicity, detailed description of the pump circuit 41 is omitted.

The pump circuit 41 is used for generating a driving signal INB' in response to a driving signal INB, wherein the driving signal INB' has higher driving ability than the driving signal INB. The driving signal INB is an inverted signal of the input signal IN. In other words, the pump circuit 41 is used for increasing driving ability of input signals.

The PMOS transistor 42 is coupled to the pump circuit 41, the NMOS transistor 43, the source follower transistor 44 and the load element 45. The PMOS transistor 42 is supplied by the power supply VDDD. The PMOS transistor 42 is driven by the driving signal IN.

The PMOS transistor 42 includes a source terminal coupled to the power supply VDDD, a gate terminal coupled to the input signal IN and a drain terminal coupled to the load element 45.

The NMOS transistor 43 is coupled to the PMOS transistor 42, the source follower transistor 44 and the load element 45. The NMOS transistor 43 is also driven by the driving signal IN.

The NMOS transistor 43 includes a source terminal coupled to GND, a gate terminal coupled to the input signal IN and a drain terminal coupled to the load element 45.

The source follower transistor 44 includes a source terminal coupled to the load element 45, a gate terminal coupled to the driving signal INB' and a drain terminal coupled to the power supply VDDD.

Because the gate voltage of the source follower transistor 44 is pumped to VDDD+ΔV, the source follower transistor 44 has higher conduction current. For example, assume VDDD=Vth+0.2V (Vth referring to threshold voltages of the transistors 42~44). So, Vgs (gate-source voltage) of the PMOS transistor 42 is 0.2V while Vgs (gate-source voltage) of the source follower transistor 44 is 0.2V+ΔV. So, the conduction currents provided by the PMOS transistor 42 and the source follower transistor 44 are in ratio as following:

$$\frac{I44}{I42} = \frac{(0.2 + \Delta V)^2}{0.2^2}$$

Wherein I42 and I44 refer to the conduction currents provided by the PMOS transistor 42 and the source follower transistor 44.

Usually, ΔV is designed to be equal to Vth. If ΔV=0.6V, then $$\frac{I44}{I42} = 16$$

In other words, the source follower transistor 44 has higher driving ability and the driving ability of the driving circuit applying the source follower transistor 44 is also higher.

Further, in this embodiment, if the transistors 42~44 are made via low end process, i.e. they have thick gate oxide, the transistors 42~44 can stand high gate voltage.

Third Embodiment

Figure 5:
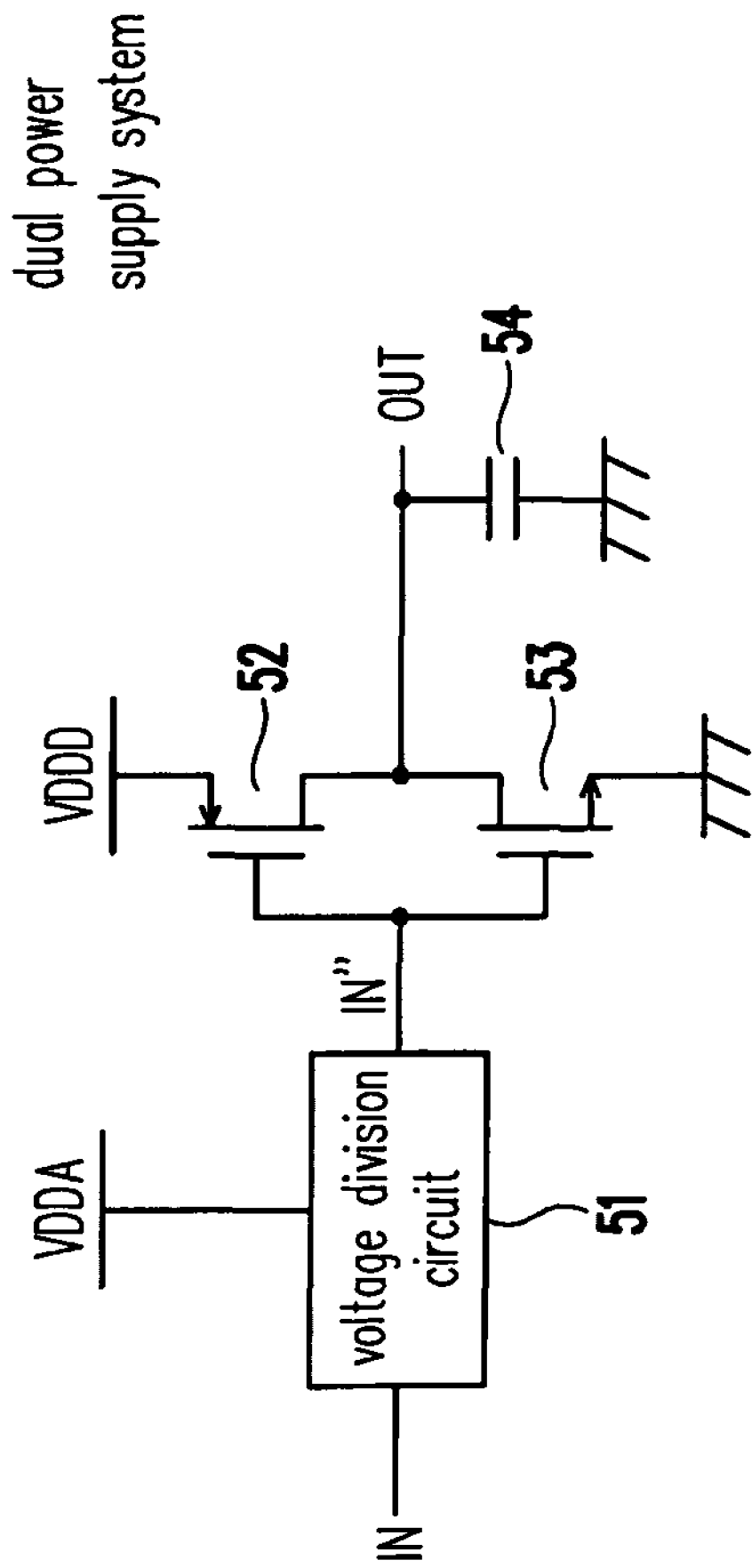
FIG. 5 shows a circuit diagram of a driving circuit according to a third embodiment of the invention.

FIG. 5 shows a circuit diagram of a logic gate used as a driving circuit according to a third embodiment of the invention. As shown in FIG. 5, the driving circuit according to the third embodiment of the invention includes a voltage division circuit 51, a PMOS transistor 52 and a NMOS transistor 53. The driving circuit according to the third embodiment of the invention is implemented under dual power supply system (VDDD and VDDA). VDDA is higher than VDDD. VDDA is for example but not limited to 13.5V while VDDD is for example but not limited to 3.5V, 2.5V or 1.8V. "OUT" refers to an output signal. The load element 54 is represented by, for example, a load capacitor. In the third embodiment, the voltage division circuit is used to improve the driving ability.

The voltage division circuit 51 is used for generating a driving signal IN'' in response to a driving signal IN, wherein the driving signal IN'' has higher driving ability than the driving signal IN. In other words, the voltage division circuit 51 is used for increasing driving ability of input signals. The driving signal IN'' is in phase with the driving signal IN. The voltage division circuit 51 may include, for example but not limited to, serially connected resistors, transistors or diodes. The voltage division circuit 51 divides the high power supply VDDA to generate the driving signal IN''. For example, when the driving signal IN is logic L, the voltage division circuit 51 generates a logic L driving signal IN''. On the other hand, when the driving signal IN is logic H, the voltage division circuit 51 generates a logic H driving signal IN'', while the logic H driving signal IN'' has higher voltage level than the logic H driving signal IN. The voltage division circuit 61 is supplied by the high power supply VDDA. In other words, VDDA>IN'' (logic H)>VDDD.

The PMOS transistor 52 is coupled to the voltage division circuit 51, the NMOS transistor 53 and the load element 54. The PMOS transistor 52 is supplied by the low power supply VDDD. The PMOS transistor 52 is driven by the driving signal IN''.

The PMOS transistor 52 includes a source terminal coupled to the low power supply VDDD, a gate terminal coupled to the driving signal IN'' and a drain terminal coupled to the load element 54.

The NMOS transistor 53 is coupled to the voltage division circuit 51, the PMOS transistor 52 and the load element 54. The NMOS transistor 53 is also driven by the driving signal IN''.

The NMOS transistor 53 includes a source terminal coupled to GND, a gate terminal coupled to the driving signal IN'' and a drain terminal coupled to the load element 54.

Further, in this embodiment, if the transistors 52 and 53 are made via low end process, i.e. they have thick gate oxide, then the transistors 52 and 53 can stand high gate voltage.

Third Embodiment

Figure 6:
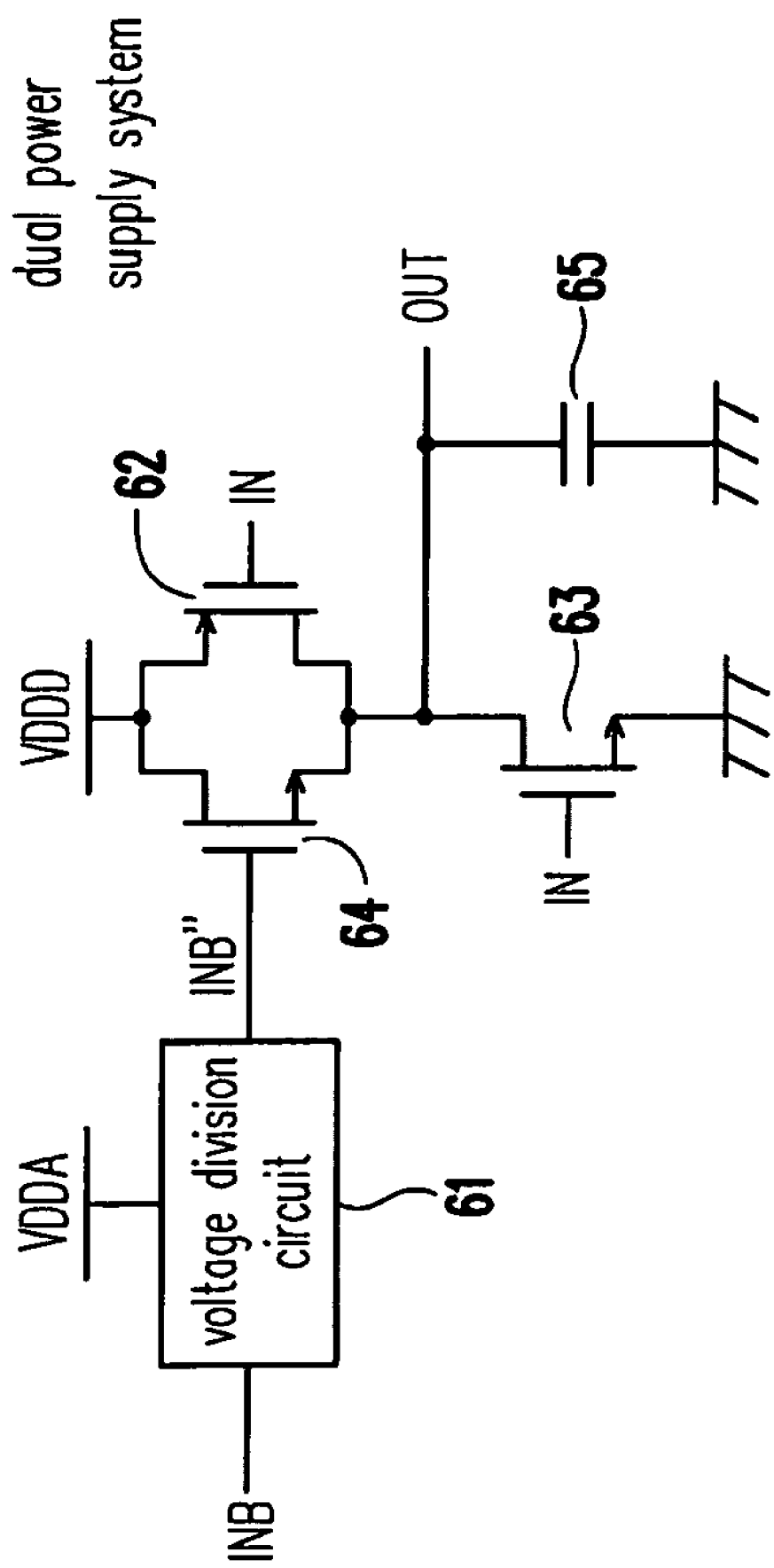
FIG. 6 shows a circuit diagram of a driving circuit according to a fourth embodiment of the invention.

FIG. 6 shows a circuit diagram of a driving circuit according to a fourth embodiment of the invention. As shown in FIG. 6, the driving circuit according to the fourth embodiment of the invention includes a voltage division circuit 61, a PMOS transistor 62, a NMOS transistor 63 and a source follower transistor 64. The driving circuit according to the fourth embodiment of the invention is implemented under dual power supply system (VDDD and VDDA). VDDA is higher than VDDD. VDDA is for example but not limited to 13.5V while VDDD is for example but not limited to 3.5V, 2.5V or 1.8V. "OUT" refers to an output signal. The load element 65 is for example, a load capacitor. In this embodiment, the voltage division circuit is used to improve the driving ability.

The voltage division circuit 61 is used for generating a driving signal INB'' in response to a driving signal INB, wherein the driving signal INB'' has higher driving ability than the driving signal INB. The driving signal INB is an inverted signal of an input signal IN. In other words, the voltage division circuit 61 is used for increasing driving ability of input signals. The driving signal INB'' is in phase with the driving signal INB but in inverted phase with the input signal IN. The voltage division circuit 61 may include, for example but not limited to, serially connected resistors, transistors or diodes. The voltage division circuit 61 divides the high power supply VDDA to generate the driving signal INB''. For example, when the driving signal INB is logic L (i.e. the signal IN is logic H), the voltage division circuit 61 generates a logic L driving signal INB''. On the other hand, when the driving signal INB is logic H (i.e. the signal IN is logic L), the voltage division circuit 61 generates a logic H driving signal INB'', while the logic H driving signal INB'' has higher voltage level than the logic H driving signal INB. The voltage division circuit 61 is supplied by the high power supply VDDA. In other words, VDDA>INB'' (logic H)>VDDD.

The PMOS transistor 62 is coupled to the voltage division circuit 61, the NMOS transistor 63, the source follower transistor 64 and the load element 45. The PMOS transistor 62 is supplied by the low power supply VDDD. The PMOS transistor 62 is driven by the input signal IN.

The PMOS transistor 62 includes a source terminal coupled to the power supply VDDD, a gate terminal coupled to the input signal IN and a drain terminal coupled to the load element 65. The load element 65 is charged by the PMOS transistor 62.

The NMOS transistor 63 is coupled to the voltage division circuit 61, the PMOS transistor 62, the source follower transistor 64 and the load element 65. The NMOS transistor 63 is also driven by the input signal IN.

The NMOS transistor 63 includes a source terminal coupled to GND, a gate terminal coupled to the input signal IN and a drain terminal coupled to the load element 65. The load element 65 is discharged by the NMOS transistor 63.

The source follower transistor 64 includes a source terminal coupled to the load element 65, a gate terminal coupled to the driving signal INB" and a drain terminal coupled to the power supply VDDD. The load element 65 is also charged by the source follower transistor 64. The source follower transistor 64 conducts more current than the PMOS transistor 62. Detailed description of why the source follower transistor 64 conducts more current than the PMOS transistor 62 may be the same or similar to the second embodiment, so the detailed description is omitted here for simplicity. In other words, the source follower transistor 64 has higher driving ability and the driving ability of the driving circuit applying the source follower transistor 64 is also higher.

Further, in this embodiment, if the transistors 62~64 are made via low end process, i.e. they have thick gate oxide, the transistors 62~64 can stand high gate voltage.

In the above embodiments of the invention, pump circuits or voltage division circuits may be used as signal enhancing circuits which may enhance driving ability of driving signals. Further, source follower transistors may further enhance driving ability of the driving circuits, by charging high current to loading, so that output signals of the driving circuits may transit to logic H more rapidly. In other words, the pull high ability of the driving circuits is enhanced.

The above embodiment of the present invention may be applicable in, for example but not limited to buffers of source driving circuits in image display devices. The image display devices are for example but not limited to TFT-LCD monitors, TFT-LCD TV-sets or the like.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A driving circuit, comprising:
    a signal enhancing circuit, for generating a second input signal in response to an inverted signal of a first input signal, wherein the second input signal has a higher driving ability than both the first input signal and the inverted signal of the first input signal;
    a source follower transistor, coupled to the signal enhancing circuit and supplied by a first power supply, the source follower transistor being driven by the second input signal;
    a first transistor, coupled to the source follower transistor and supplied by the first power supply, the first transistor being driven by the first input signal; and
    a second transistor, coupled to the source follower transistor, the second transistor being driven by the first input signal;
    wherein the source follower transistor conducting more current than the first transistor.

2. The driving circuit of claim 1, wherein the signal enhancing circuit includes:
    a capacitor, coupled between a first node and a second node, the first node being in phase with the first input signal;
    a first switch, selectively conductive between the first power supply and the second node in response to the inverted signal of the first input signal;
    a second switch, selectively conductive between the second node and the second input signal in response to the first input signal; and
    a third switch, selectively conductive between the second input signal and GND in response to the inverted signal of the first input signal.

3. The driving circuit of claim 2, wherein the signal enhancing circuit further includes:
    a first inverter, supplied by the first power supply, the first inverter having an input terminal for receiving the first input signal and an output terminal for generating the inverted signal of the first input signal; and
    a second inverter, supplied by the first power supply, the second inverter having an input terminal for receiving the inverted signal of the first input signal and an output terminal for being coupled to the first node.

4. The driving circuit of claim 3, wherein the first switch is controlled by the inverted signal of the first input signal.

5. The driving circuit of claim 3, wherein the third switch is controlled by the inverted signal of the first input signal.

6. The driving circuit of claim 1, wherein the signal enhancing circuit includes a voltage division circuit, which is supplied by a second power supply, the voltage division circuit dividing the second power supply in response to the inverted signal of the first input signal and generating the second input signal, the second power supply being higher than the first power supply.

7. The driving circuit of claim 1, wherein the first transistor includes a source terminal coupled to the first power supply, a gate terminal coupled to the first input signal and a drain terminal coupled to a load element, the load element being charged by the first transistor.

8. The driving circuit of claim 7, wherein the second transistor includes a source terminal coupled to GND, a gate terminal coupled to the first input signal and a drain terminal coupled to the load element, the load element being discharged by the second transistor.

9. The driving circuit of claim 8, wherein the source follower transistor includes a source terminal coupled to the load element, a gate terminal coupled to the second input signal and a drain terminal coupled to the first power supply, the load element being charged by the source follower transistor.

* * * * *